United States Patent [19]
Kijima et al.

[11] Patent Number: 5,811,181
[45] Date of Patent: Sep. 22, 1998

[54] FERROELECTRIC THIN FILM, FERROELECTRIC THIN FILM COVERING SUBSTRATE AND MANUFACTURING METHOD OF FERROELECTRIC THIN FILM

[75] Inventors: Takeshi Kijima, Omiya; Sakiko Satoh, Yachiyo; Hironori Matsunaga, Noda; Masayoshi Koba, Nara; Noboru Ohtani, Tokyo, all of Japan

[73] Assignee: Sharp Kabushiki Kaisha, Osaka, Japan

[21] Appl. No.: 449,701

[22] Filed: May 24, 1995

[30] Foreign Application Priority Data

Dec. 6, 1994 [JP] Japan .................................. 6-302133

[51] Int. Cl.⁶ ...................................... B32B 17/00
[52] U.S. Cl. ....................... 428/328; 428/446; 428/697; 428/699; 428/700; 428/701; 428/702; 428/325
[58] Field of Search ..................... 428/688, 689, 428/697, 699, 700–701, 702, 328, 325, 446; 117/90, 95, 101, 106, 949; 252/62.9 R, 62.9 PZ

[56] References Cited

U.S. PATENT DOCUMENTS

5,423,285  6/1995  Paz de Araujo ........................ 117/90

FOREIGN PATENT DOCUMENTS

WO/9312542  6/1993  WIPO.

OTHER PUBLICATIONS

Si et al., "Ferroelectric bismuth titanate ... vapor deposition", Journal of Applied Physics, vol. 73, No. 11, Jun. 1, 1993, pp. 7910–7913.

Mihara et al., "Feasibility for memory ... fatigue free capacitors", pp. 137–157.

Katayama et al., "Effects of Growth Rate ... Chemical Vapor Deposition", Japanese Journal of Applied Physics, vol. 32 (1993) pp. 5062–5066 Part 1, No. 11A, Nov. 1993.

Sakashita et al., "Dependence of electrical ... chemical vapor deposition", Journal of Applied Physics, vol. 73, No. 11, Jun. 1, 1993, pp. 7857–7863.

*Primary Examiner*—Timothy Speer
*Attorney, Agent, or Firm*—Birch, Stewart, Kolasch & Birch, LLP

[57] ABSTRACT

A close a-axis orientating film having a smooth surface and excellent ferroelectric characteristics is manufactured at a low temperature with preferable reproducibility to apply ferroelectric $Bi_4Ti_3O_{12}$ to development of various kinds of devices such as a ferroelectric non-volatile memory, a pyroelectric sensor, etc. A ferroelectric $Bi_4Ti_3O_{12}$ thin film is formed on a substrate through a titanium oxide buffer layer so that closeness and surface smoothness of the $Bi_4Ti_3O_{12}$ thin film manufactured on the titanium oxide buffer layer can be improved.

5 Claims, 7 Drawing Sheets

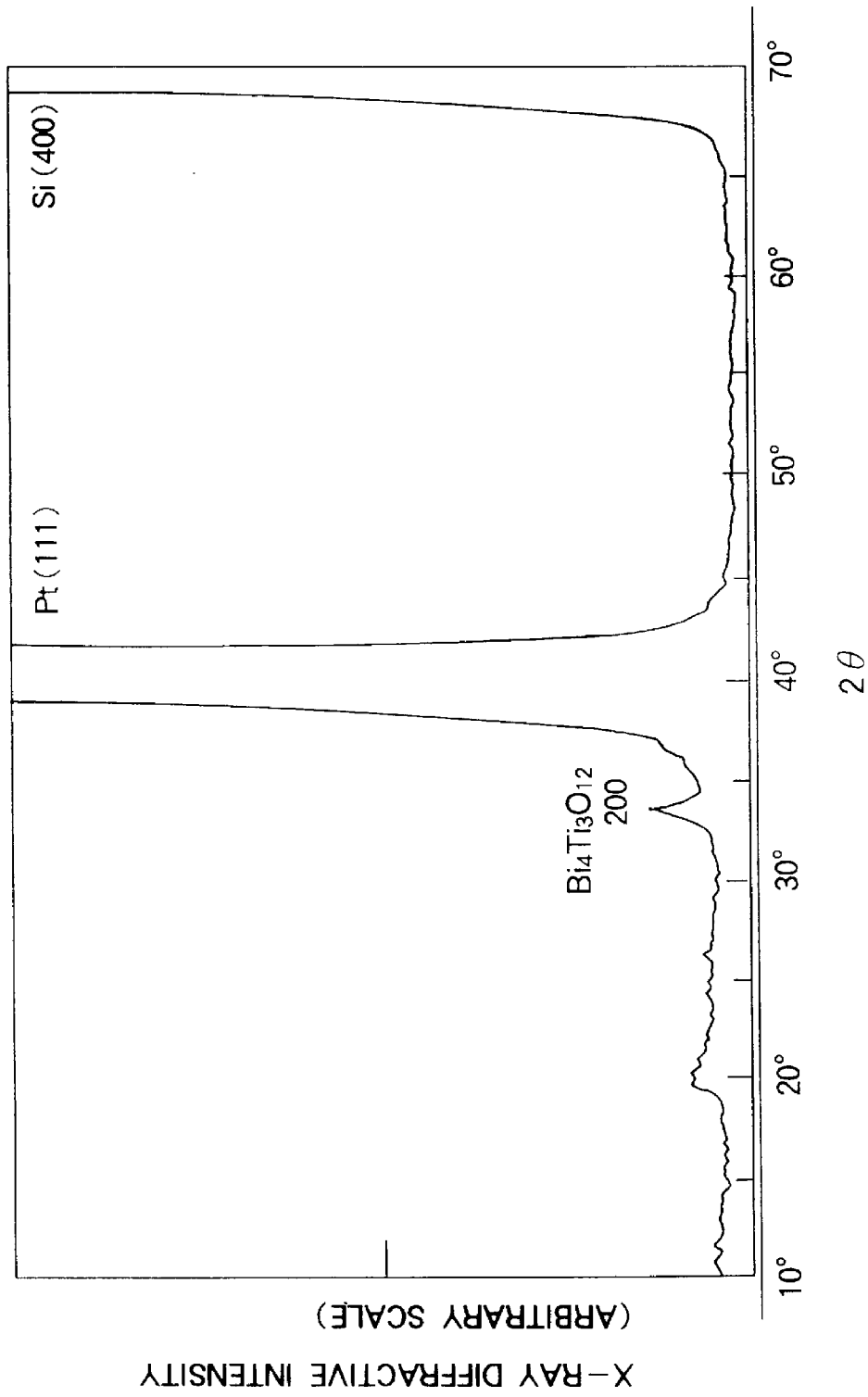

FERROELECTRIC FINE CRYSTAL GRAINS

AMORPHOUS MEDIUM

FERROELECTRIC FINE CRYSTAL GRAINS

AMORPHOUS MEDIUM

BUFFER LAYER

SUBSTRATE

FERROELECTRIC CRYSTAL LAYER

BUFFER LAYER

SUBSTRATE

FERROELECTRIC THIN FILM, FERROELECTRIC THIN FILM COVERING SUBSTRATE AND MANUFACTURING METHOD OF FERROELECTRIC THIN FILM

BACKGROUND OF THE INVENTION

1. Field of the Invention

The present invention relates to a ferroelectric thin film, a ferroelectric thin film covering substrate and a method for manufacturing the ferroelectric thin film. More particularly, the present invention relates to an oxide ferroelectric thin film, an oxide ferroelectric thin film covering substrate and a method for manufacturing the oxide ferroelectric thin film used in a ferroelectric memory element, a pyroelectric sensor element, a piezoelectric element, etc.

2. Description of the Related Art

A ferroelectric substance has many functions of spontaneous polarization, a high dielectric constant, electooptic effects, piezoelectric effects, pyroelectric effects, etc. Accordingly, the ferroelectric substance is applied to development of devices in a wide range such as a capacitor, an oscillator, an optical modulator, an infrared sensor, etc. In these applications, monocrystals of glycine sulfate (TGS), $LiNbO_3$, $LiTaO_3$, etc., and sintered ceramics of $BaTiO_3$, $PbTiO_3$, $Pb(Zr_{1-x} Ti_x)O_3$(PZT), PLZT, etc. as ferroelectric materials are generally used by cutting and polishing the monocrystals and the sintered ceramics such that each of the monocrystals and the sintered ceramics has about 50 μm in thickness. However, it is difficult to manufacture a large-sized monocrystal and the large-sized monocrystal is expensive. Further, it is difficult to process the large-sized monocrystal since the large-sized monocrystal has a cleavage property. In contrast to this, ceramics are generally fragile and it is difficult to process the ceramics to a thickness equal to or smaller than 50 μm since the ceramics may be cracked in a manufacturing process, etc. Therefore, it takes much time and labor to process the ceramics so that the production cost of the ceramics is increased.

An application field of these ferroelectric thin films at the present time has widened as thin film forming techniques have progressed. In particular, a ferroelectric non-volatile memory (FRAM) having a high density and operated at a high speed has recently been developed actively by combining this ferroelectric non-volatile memory with a semiconductor memory element of a DRAM, etc. In such device development, it is necessary to use a material having a large value of residual spontaneous Polarization (Pr), a small resisting electric field (Ec), a low leak electric current and a large repetitious resisting property of polarization inversion. Further, it is desirable to realize the above characteristics by a thin film having a thickness equal to or smaller than 200 nm so as to adapt this thin film to a reduction in operating voltage and a fine manufacturing process of a semiconductor.

Each of oxide ferroelectric substances of $PbTiO_3$, PZT, PLZT, etc. are conventionally formed as a thin film by a sputtering method, an evaporation method, a sol-gel method, a MOCVD method, etc. as a trial so as to apply each of the oxide ferroelectric substances to the FRAM, etc.

$Pb(Ti_{1-x} Zr_x)O_3$(PZT) among the above materials. A thin film having preferable ferroelectric characteristics can be made of $Pb(Ti_{1-x}Zr_x)O_3$ (PZT) by using the sputtering method and the sol-gel method. This thin film has a large value of residual spontaneous polarization Pr ranging from 10 μC/cm² to 26 μC/cm². However, although ferroelectric characteristics of the PZT greatly depend on composition x, a change in film composition tends to be caused at times of film formation and heat treatment, etc. since the PZT includes Pb having a high vapor pressure. Further, a pin hole tends to be caused and a low dielectric contact layer, etc. tend to be caused by a reaction of Pb and Pt of a lower electrode. As a result, a leak electric current is caused and a resisting property of polarization inversion is reduced as the film thickness is reduced. Therefore, it is desirable to develop another material having excellent ferroelectric characteristics and an excellent resisting property of polarization inversion.

Y1 attracts public attention as a material having preferable ferroelectric characteristics and an excellent resisting property of polarization inversion. Y1 is an oxide material formed in a Bi layer shape and shown by a chemical formula of $SrBi_2Ta_2O_9$ and is manufactured by a MOD method including the following processes. Namely, similar to the sol-gel method, organic metallic raw materials are mixed with one another such that the organic metallic raw materials are constructed by a predetermined film composition. A raw material solution for coating adjusted in density (concentration) and viscosity is then made. This raw material solution is spin-coated and formed on a substrate and is dried. Further, the dried raw material coating film is temporarily burned to remove organic components therefrom. This processing is repeated until this raw material coating film has a predetermined thickness. Finally, the raw material coating film is crystallized by main burning. Accordingly, control of the film thickness is limited by the thickness of a coating formed at one time. A greatest problem of Y1 as a ferroelectric thin film material is that a burning temperature is an extremely high temperature ranging from 750° C. to 800° C. and a sintering time is a long time equal to or longer than one hour. When the burning temperature in a manufacturing process exceeds 600° C., a mutual diffusive reaction between a lower platinum electrode and the ferroelectric substance is caused. Further, a reaction between the lower electrode and each of silicon and a silicon oxide under this lower electrode is caused. A change in film composition is also caused by volatilization of constructional elements from the ferroelectric thin film. Accordingly, it is difficult to apply Y1 to processes for actually manufacturing an integrated device. Only a film having a large grain diameter can be obtained at the present time so that no Y1 can be adapted to fine processing of a submicron geometry required to develop a highly integrated device. Further, since the film is formed by coating, there are problems involved due to a reduction in ferroelectric characteristics in a step difference portion and disconnection of wiring. Accordingly, Y1 still has a great problem as a ferroelectric thin film material although Y1 is excellent with respect to the ferroelectric characteristics and the resisting property of polarization inversion.

In contrast to this, there are a group of bismuth oxide ferroelectric substances having a layered crystal structure represented by the following general chemical formula as an oxide ferroelectric substance, including no Pb, which has bad influences on a leak electric current and a resisting property of polarization inversion.

In this chemical formula, A is represents $Na^{1+}$, $K^{1+}$, $Pb^{2+}$, $Ca^{2+}$, $Sr^{2+}$, $Ba^{2+}$, $Bi^{3+}$, etc. B represents $Fe^{3+}$, $Ti^{4+}$, $Nb^{5+}$, $Ta^{5+}$, $W^{6+}$, $Mo^{6+}$, etc. and m is a number from 1 to 8. This crystal structure is basically comprises by a structure in which $(Bi_2O_2)^{2+}$ layers sandwich a perovskite layer formed by continuous perovskite gratings composed of (m−1)

$ABO_3$. With respect to these materials, ferroelectricity is shown in many cases in a combination in which A is represented by one of Sr, Ba and Bi and B is represented by one of Ti, Ta and Nb. The above Y1 is one kind of this bismuth oxide ferroelectric substance.

$Bi_4Ti_3O_{12}$ (bismuth titanate) among these materials is a ferroelectric substance having a layered perovskite structure having strong anisotropy. In this layered perovskite structure, rhombic system/grating constant is shown by a=5.411 Å, b=5.448 Å and c=32.83 Å. A monocrystal of $Bi_4Ti_3O_{12}$ has excellent ferroelectric characteristics in which Pr=50 $\mu C/cm^2$ and Ec=50 kV/cm in an a-axis direction and Pr=4 $\mu C/cm^2$ and Ec=4 kV/cm in a c-axis direction. It is desirable to provide many a-axis components of the crystal in a direction perpendicular to a substrate so as to apply this material of $Bi_4Ti_3O_{12}$ to a ferroelectric non-volatile memory, etc.

A thin film of $Bi_4Ti_3O_{12}$ is formed so far as a trial by a MOCVD method and a sol-gel method. However, in many general reports, a manufactured thin film of $Bi_4Ti_3O_{12}$ is formed as a film orientated on the c-axis. A material of $Bi_4Ti_3O_{12}$ actually has no sufficiently large Pr in the a-axis direction. This is because it is considered that plate-shaped crystal grains thin in the c-axis direction tend to be formed by anisotropy of a crystal growing speed reflecting extremely large anisotropy of the crystal structure of $Bi_4Ti_3O_{12}$ so that a film orientated on the c-axis tends to be obtained. Accordingly, it is desirable to establish a method for manufacturing a thin film of $Bi_4Ti_3O_{12}$ having components in the a-axis direction perpendicular to the substrate as much as possible with preferable reproducibility so as to efficiently provide excellent ferroelectric characteristics of $Bi_4Ti_3O_{12}$.

When the thin film of $Bi_4Ti_3O_{12}$ is manufactured on a metallic electrode of platinum (Pt), etc. by the MOCVD method, a generating density of crystal nuclei is small on a substrate surface and plate-shaped coarse crystal grains tend to be generated as mentioned above. Therefore, irregularities of a film surface are severe and cause a pin hole when the film thickness is thin. These irregularities also cause a leak electric current and reduce an accuracy in fine processing of the film in device manufacture. Accordingly, it is desirable to establish a method for manufacturing a closer thin film of $Bi_4Ti_3O_{12}$ having a smooth surface so as to reduce an operating voltage of the device and adapt this method to semiconductor processes.

SUMMARY OF THE INVENTION

It is therefore an object of the present invention to provide a ferroelectric thin film which can be manufactured at a temperature equal to or lower than 600° C. and has excellent ferroelectric characteristics, a small leak electric current and a resisting property of polarization inversion sufficient to be resistible to practical use.

Another object of the present invention is to provide a covering substrate of this ferroelectric thin film and a method for manufacturing this ferroelectric thin film.

To achieve the above objects, a ferroelectric thin film (having a first construction) of the present invention is characterized in that the ferroelectric thin film is constructed by diffusing fine crystal grains of a ferroelectric substance into an amorphous medium including elements constituting the ferroelectric substance.

A ferroelectric thin film (having a second construction) of the present invention is characterized in that the ferroelectric substance diffused into the amorphous medium as fine crystal grains has a layered crystal structure shown by a chemical formula of $Bi_2A_{m-1}B_mO_{3m+3}$ where A is selected from $Na^{1+}$, $K^{1+}$, $Pb^{2+}$, $Ca^{2+}$, $Sr^{2+}$, $Ba^{2+}$ and $Bi^{3+}$ and B is selected from $Fe^{3+}$, $Ti^{4+}$, $Nb^{5+}$, $Ta^{5+}$, $W^{6+}$ and $Mo^{6+}$ and m is a natural number from 1 to 8.

A ferroelectric thin film (having a third construction) of the present invention is characterized in that the ferroelectric substance diffused into the amorphous medium as fine crystal grains is formed by $Bi_4Ti_3O_{12}$ and the amorphous medium is formed by a titanium oxide.

A ferroelectric thin film covering substrate (having a fourth construction) of the present invention is characterized in that a ferroelectric thin film is constructed by diffusing fine crystal grains of a ferroelectric substance into an amorphous medium including elements constituting the ferroelectric substance and is formed on a substrate through a buffer layer.

A ferroelectric thin film covering substrate (having a fifth construction) of the present invention is characterized in that the ferroelectric substance is represented by a chemical formula of $Bi_2A_{m-1}B_mO_{3m+3}$ where A is selected from $Na^{1+}$, $K^{1+}$, $Pb^{2+}$, $Ca^{2+}$, $Sr^{2+}$, $Ba^{2+}$ and $Bi^{3+}$ and B is selected from $Fe^{3+}$, $Ti^{4+}$, $Nb^{5+}$, $Ta^{5+}$, $W^{6+}$ and $Mo^{6+}$ and m is a natural number from 1 to 8. Further, the ferroelectric thin film is constructed by diffusing the fine crystal grains of the ferroelectric substance into the amorphous medium including elements constituting the ferroelectric substance and is formed on the substrate through the buffer layer.

A ferroelectric thin film covering substrate (having a sixth construction) of the present invention is characterized in that the ferroelectric thin film is formed by diffusing the fine crystal grains of the ferroelectric substance of $Bi_4Ti_3O_{12}$ into the amorphous medium of a titanium oxide and is formed on the substrate through the buffer layer.

A ferroelectric thin film covering substrate (having a seventh construction) of the present invention is characterized in that a ferroelectric thin film is formed by a ferroelectric substance having a layered crystal structure shown by a chemical formula of $Bi_2A_{m-1}B_mO_{3m+3}$ where A is selected from $Na^{1+}$, $K^{1+}$, $Pb^{2+}$, $Ca^{2+}$, $Sr^{2+}$, $Ba^{2+}$ and $Bi^{3+}$ and B is selected from $Fe^{3+}$, $Ti^{4+}$, $Nb^{5+}$, $Ta^{5+}$, $W^{6+}$ and $Mo^{6+}$ and m is a natural number from 1 to 8. Further, the ferroelectric thin film is formed on a substrate through a buffer layer formed by a titanium oxide.

A ferroelectric thin film covering substrate (having an eighth construction) of the present invention is characterized in that the ferroelectric thin film is formed by $Bi_4Ti_3O_{12}$ and is formed on the substrate through the buffer layer formed by a titanium oxide.

A ferroelectric thin film manufacturing method (having a ninth construction) of the present invention is characterized in that this manufacturing method comprises the steps of forming a titanium oxide buffer layer on a substrate by a MOCVD method; and continuously forming a bismuth oxide ferroelectric thin film having a layered crystal structure on the titanium oxide buffer layer.

A ferroelectric thin film manufacturing method (having a tenth construction) of the present invention is characterized in that this manufacturing method comprises the steps of forming a titanium oxide buffer layer on a substrate by a MOCVD method; and continuously forming a ferroelectric thin film of $Bi_4Ti_3O_{12}$ having a layered crystal structure on the titanium oxide buffer layer.

A ferroelectric thin film manufacturing method (having an eleventh construction) of the present invention is characterized in that a substrate temperature is set to a constant temperature from 300° C. to 400° C. to obtain an a-axis orientating film in the step for forming the titanium oxide buffer layer and the step for continuously forming the $Bi_4Ti_3O_{12}$ ferroelectric thin film on the titanium oxide buffer layer.

A ferroelectric thin film manufacturing method (having a twelfth construction) of the present invention is characterized in that the manufacturing method further comprises a step for heat-treating the $Bi_4Ti_3O_{12}$ ferroelectric thin film for a constant time at a constant temperature ranging from 300° C. to 500° C. so as to improve a-axis orientation of the $Bi_4Ti_3O_{12}$ ferroelectric thin film.

In the ferroelectric thin film (having the first construction) of the present invention, the fine crystal grains of a ferroelectric substance are diffused into the amorphous medium including elements constituting the ferroelectric substance. Accordingly, ferroelectric characteristics of the ferroelectric substance can be effectively obtained.

In the ferroelectric thin film (having the second construction) of the present invention, the fine crystal grains of a bismuth oxide ferroelectric substance are diffused into the amorphous medium including elements constituting the ferroelectric substance. Accordingly, ferroelectric characteristics of the bismuth oxide ferroelectric substance can be effectively obtained.

In the ferroelectric thin film (having the third construction) of the present invention, the fine crystal grains of $Bi_4Ti_3O_{12}$ are diffused into the amorphous medium of a titanium oxide so that ferroelectric characteristics of $Bi_4Ti_3O_{12}$ can be effectively obtained.

In the ferroelectric thin film covering substrate (having the fourth construction) of the present invention, the fine crystal grains of a ferroelectric substance are diffused into the amorphous medium including elements constituting the ferroelectric substance. Accordingly, ferroelectric characteristics of the ferroelectric substance can be effectively obtained so that a substrate having excellent ferroelectric characteristics can be realized. Further, it is possible to realize a close thin film covering substrate having a smooth surface by the buffer layer.

In the ferroelectric thin film covering substrate (having the fifth construction) of the present invention, the fine crystal grains of a bismuth oxide ferroelectric substance are diffused into the amorphous medium including elements constituting the ferroelectric substance. Accordingly, ferroelectric characteristics of the bismuth oxide ferroelectric substance can be effectively obtained so that a substrate having excellent ferroelectric characteristics can be realized. Further, it is possible to realize a close thin film covering substrate having a smooth surface by the titanium oxide buffer layer.

In the ferroelectric thin film covering substrate (having the sixth construction) of the present invention, the fine crystal grains of $Bi_4Ti_3O_{12}$ are diffused into the amorphous medium of a titanium oxide so that ferroelectric characteristics of $Bi_4Ti_3O_{12}$ can be effectively obtained and a substrate having excellent ferroelectric characteristics can be realized. It is also possible to realize a close thin film covering substrate having a smooth surface by the titanium oxide buffer layer. Further, the titanium oxide buffer layer and the amorphous titanium oxide medium do not include elements except for constructional elements of $Bi_4Ti_3O_{12}$ as a ferroelectric substance. Accordingly, there is no fear of mixing of impurities into the thin film as a deteriorating cause of film characteristics so that a reduction in film characteristics can be avoided.

In the ferroelectric thin film covering substrate (having the seventh construction) of the present invention, the ferroelectric thin film is formed by a bismuth oxide ferroelectric substance having a layered crystal structure and is formed on a substrate through the buffer layer formed by a titanium oxide. Accordingly, a close thin film covering substrate having a smooth surface can be realized.

In the ferroelectric thin film covering substrate (having the eighth construction) of the present invention, the ferroelectric thin film constructed by $Bi_4Ti_3O_{12}$ is formed on the substrate through the buffer layer constructed by a titanium oxide so that a close thin film covering substrate having a smooth surface can be realized.

In the manufacturing method of the ferroelectric thin film (having the ninth construction) of the present invention, the titanium oxide buffer layer is formed on a substrate by the MOCVD method. Accordingly, a close ferroelectric thin film having a smooth surface can be manufactured with preferable reproducibility and a leak electric current can be reduced and a thinner film having preferable ferroelectric characteristics can be realized. Since the ferroelectric thin film is close and has a smooth surface, a sufficient processing accuracy can be also secured by fine processing such as semiconductor processing so that the manufacturing method can be easily applied to development of an integrated device.

In the manufacturing method of the ferroelectric thin film (having the tenth construction) of the present invention, a close ferroelectric thin film of $Bi_4Ti_3O_{12}$ having a smooth surface can be manufactured with preferable reproducibility and a leak electric current can be reduced and a thinner film having preferable ferroelectric characteristics can be realized. Since the ferroelectric thin film is close and has a smooth surface, a sufficient processing accuracy can be also secured by fine processing such as semiconductor processing so that the manufacturing method can be easily applied to development of an integrated device.

In the manufacturing method of the ferroelectric thin film (having the eleventh construction) of the present invention, the substrate temperature is set to a constant temperature from 300° C. to 400° C. to obtain an a-axis orientating film in the step for forming the titanium oxide buffer layer and the step for continuously forming the $Bi_4Ti_3O_{12}$ ferroelectric thin film on the titanium oxide buffer layer. Accordingly, a close a-axis orientating film can be formed at a low substrate temperature. Thus, the leak electric current can be sufficiently reduced when the thin film has a thickness equal to smaller than 200 nm. Accordingly, ferroelectricity having a preferable residual spontaneous polarization and a preferable resisting electric field can be obtained. Further, it is possible to obtain a close thin film having a smooth surface to such an extent that a sufficient processing accuracy is also obtained in a fine process. Since the film can be formed at a low temperature, a thermal influence on a lower element can be also avoided when the film is formed on a substrate having elements made in advance. Accordingly, the manufacturing method can be applied to development of various kinds of devices such as a ferroelectric non-volatile memory, a pyroelectric element, etc. Further, the titanium oxide buffer layer and the amorphous titanium oxide medium include no elements except for constructional elements of $Bi_4Ti_3O_{12}$ as a ferroelectric substance. Accordingly, there is no fear of mixing of impurities into the thin film a s a deteriorating cause of film characteristics so that a reduction in film characteristics can be avoided.

In the manufacturing method of the ferroelectric thin film (having the twelfth construction) of the present invention, the $Bi_4Ti_3O_{12}$ ferroelectric thin film is heat-treated for a constant time at a constant temperature ranging from 300° C. to 500° C. so as to improve a-axis orientation of the $Bi_4Ti_3O_{12}$ ferroelectric thin film. Accordingly, the ferroelectric characteristics of the thin film can be further improved by improving a crystal property of the thin film.

Further objects and advantages of the present invention will be apparent from the following description of the preferred embodiments of the present invention as illustrated in the accompanying drawings.

Figure 2A:
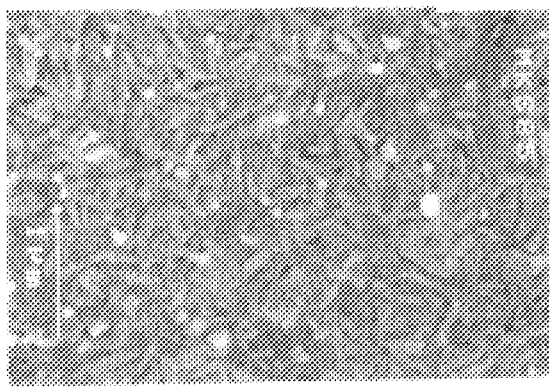
Figure 2C:
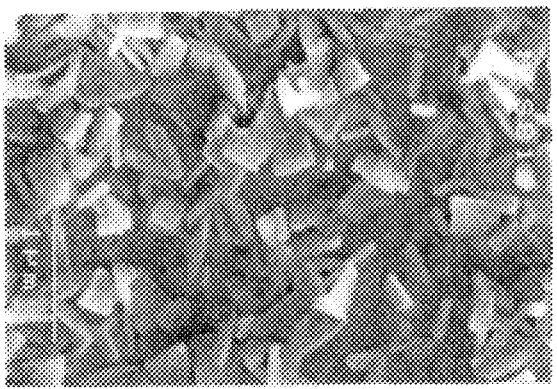
Figure 2B:
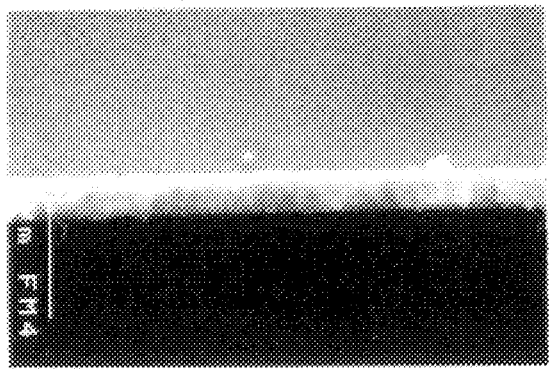
Figure 2D:
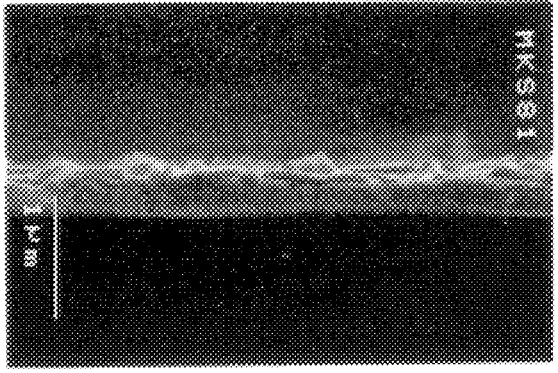
Figure 3A:
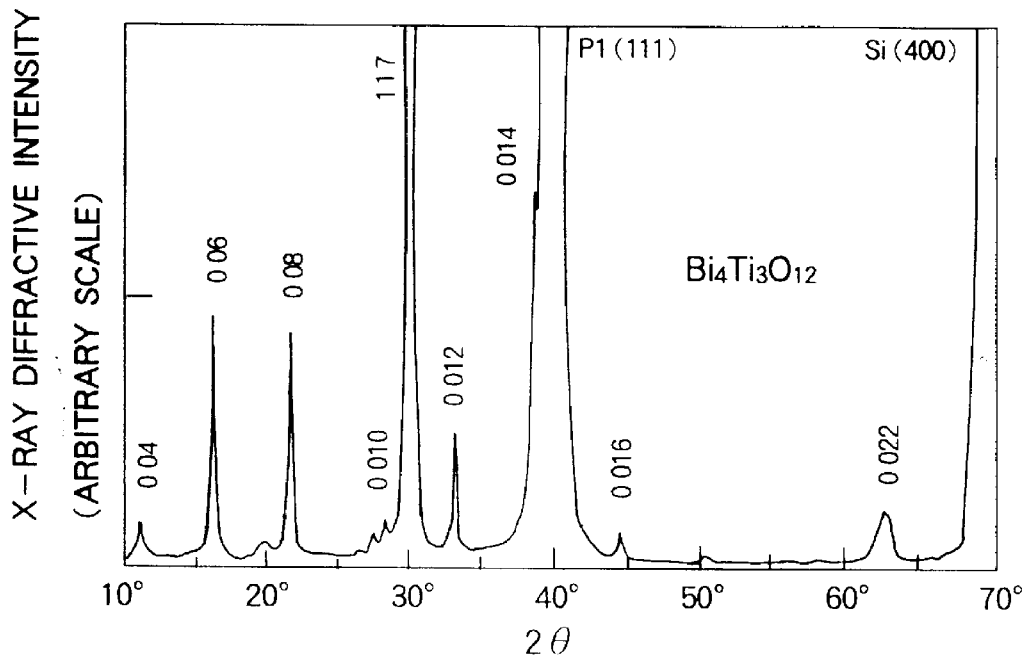
Figure 3B:
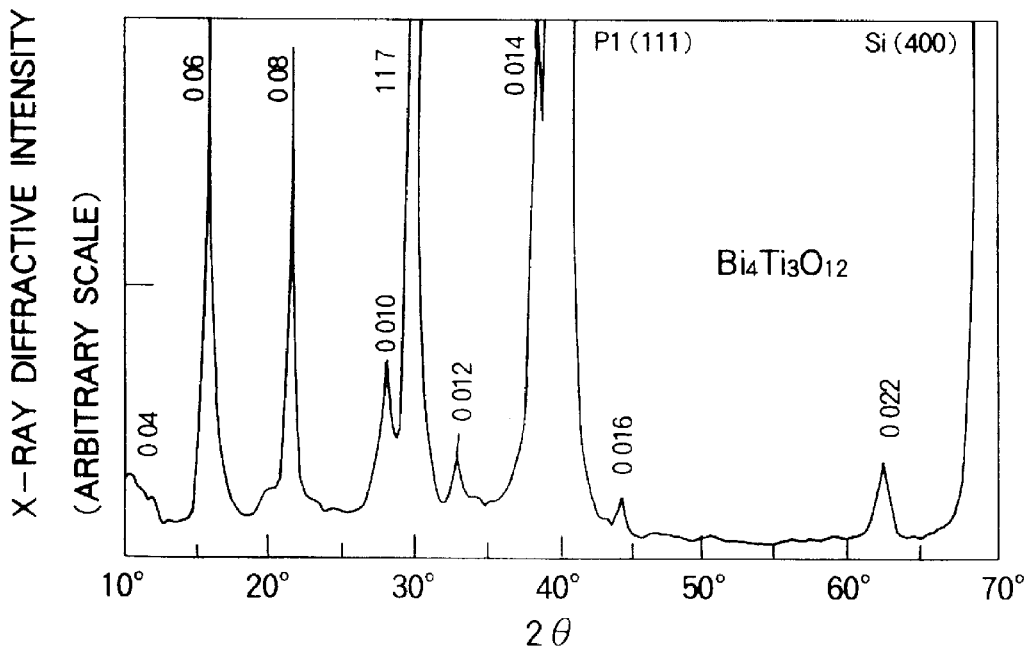
Figure 4A:
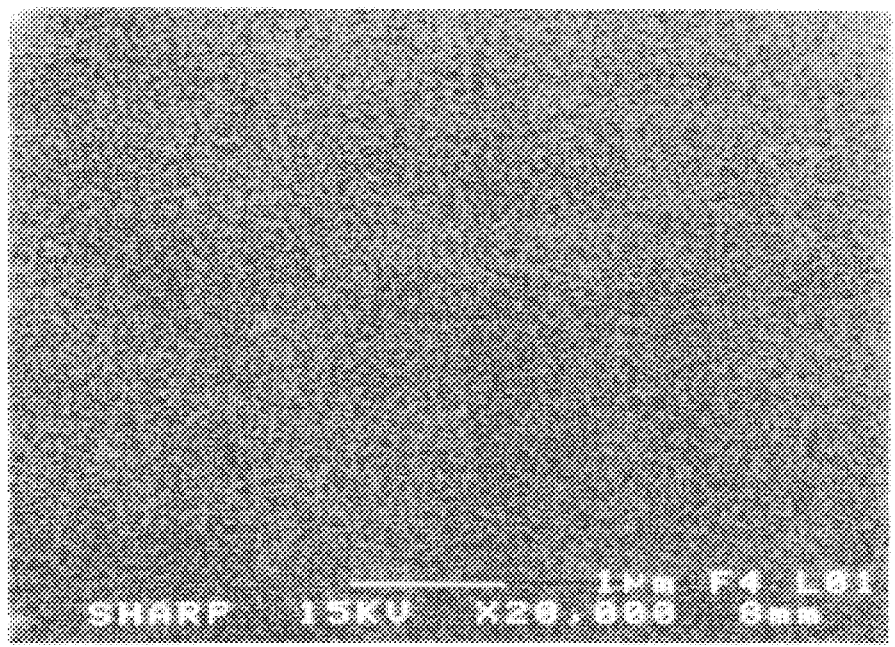
Figure 4B:
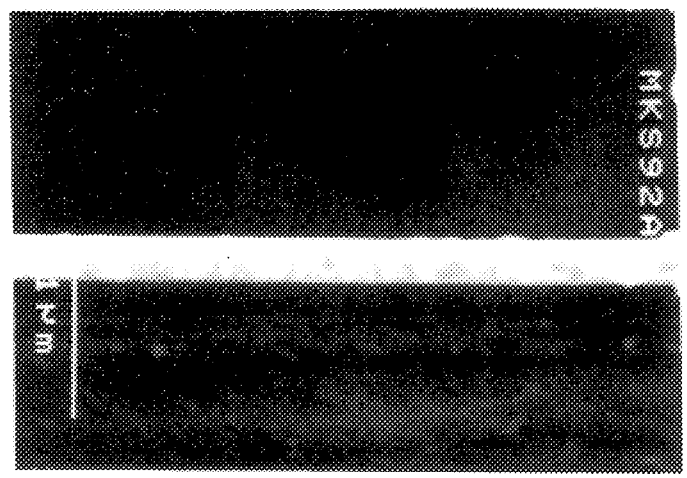
Figure 6:
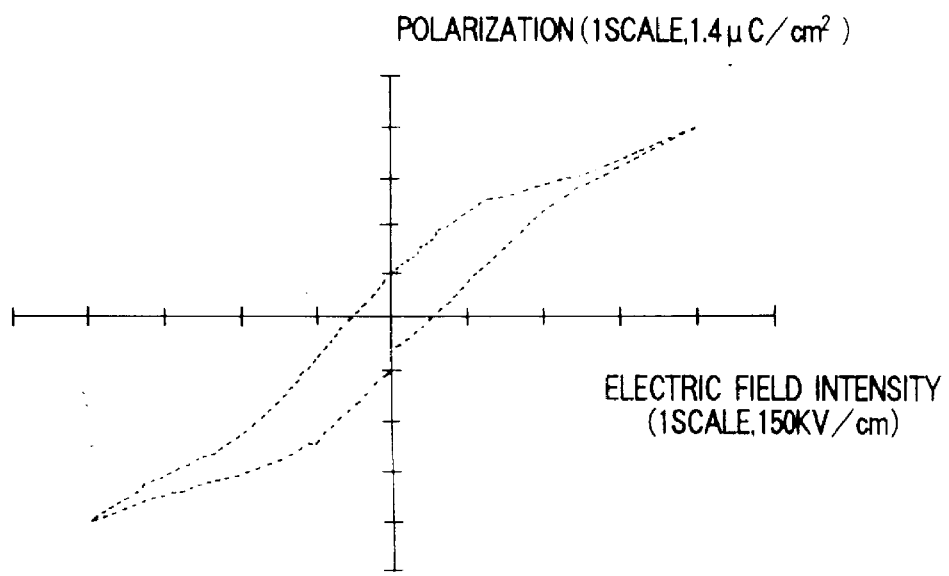
Figure 7:
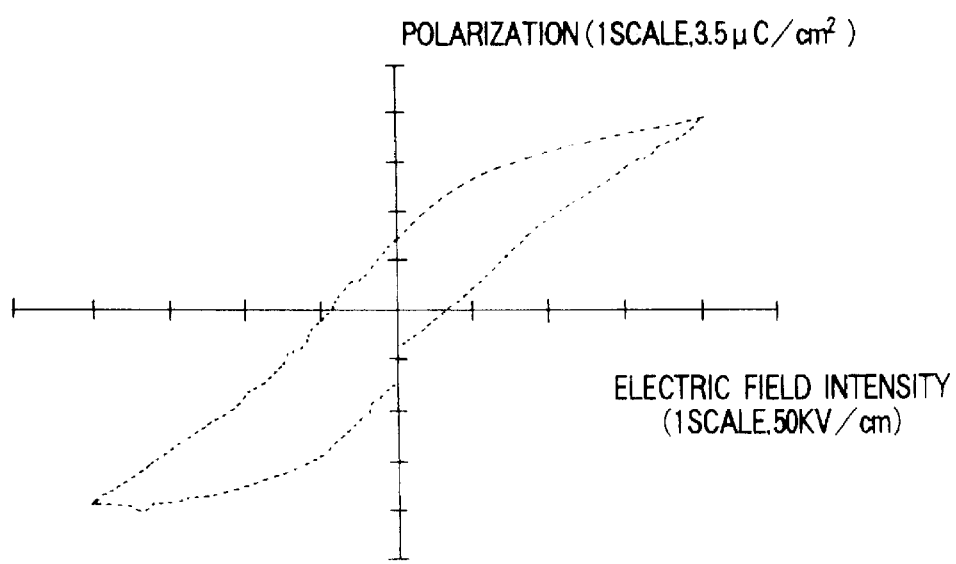
Figure 8A:
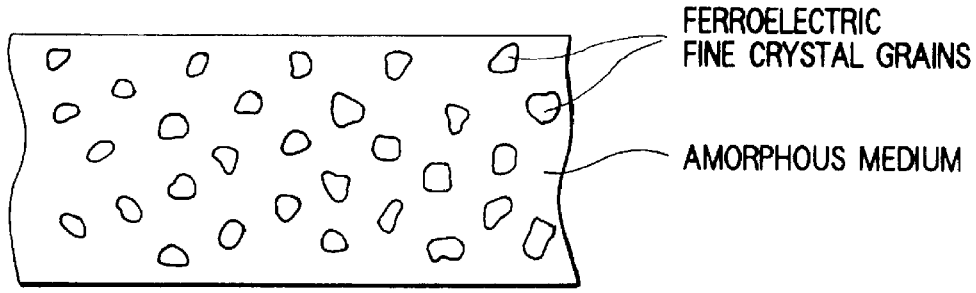
Figure 8B:
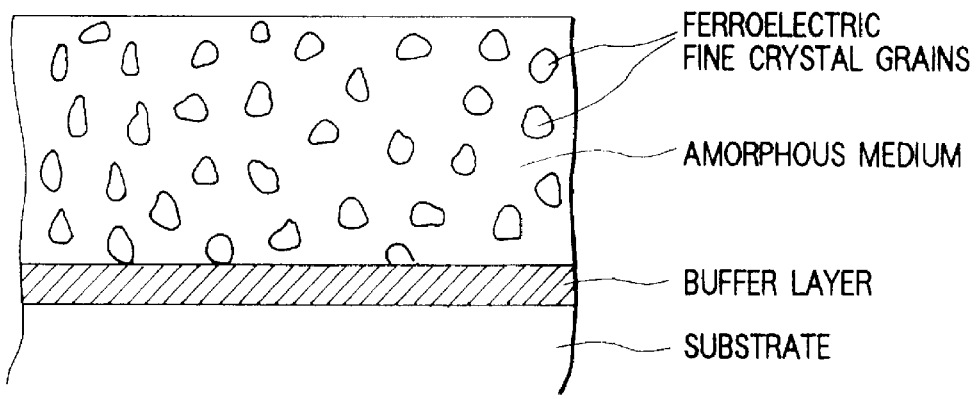
Figure 8C:
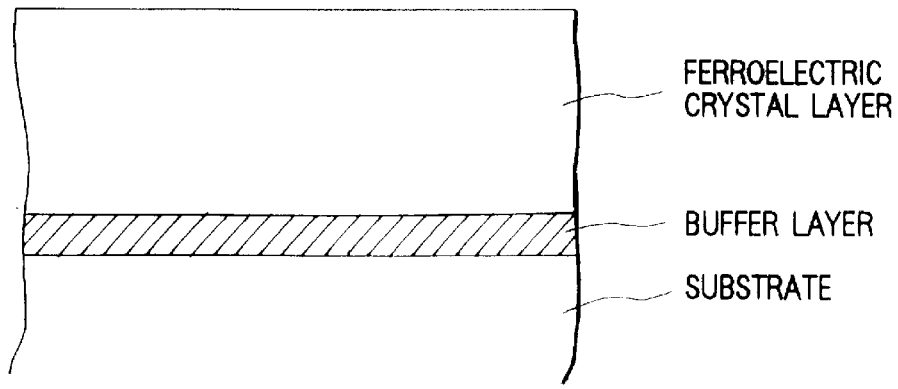

each of FIGS. 2A and 2B is a SEM photograph of a thin film of $Bi_4Ti_3O_{12}$ manufactured in accordance with a first embodiment of the present invention when there is a titanium oxide buffer layer;

each of FIGS. 2C and 2D is a SEM photograph of a thin film of $Bi_4Ti_3O_{12}$ manufactured in accordance with the first embodiment of the present invention when there is no titanium oxide buffer layer;

each of FIGS. 3a and 3b is a view showing an X-ray diffractive pattern of the $Bi_4Ti_3O_{12}$ thin film manufactured in the first embodiment of the present invention;

each of FIGS. 4a and 4b is a SEM photograph of a thin film of $Bi_4Ti_3O_{12}$ manufactured in accordance with a second embodiment of the present invention;

FIG. 5 is a view showing an X-ray diffractive pattern of the $Bi_4Ti_3O_{12}$ thin film manufactured in the second embodiment of the present invention;

FIG. 6 is a graph showing a ferroelectric hysteresis curve of $Bi_4Ti_3O_{12}$ (before heat treatment) in accordance with a third embodiment of the present invention;

FIG. 7 is a graph showing a ferroelectric hysteresis curve of $Bi_4Ti_3O_{12}$ (after heat treatment) in the third embodiment of the present invention; and each of FIGS. 8a to 8c is a view showing a structure of the $Bi_4Ti_3O_{12}$ thin film.

DESCRIPTION OF THE PREFERRED EMBODIMENTS

The preferred embodiments of a ferroelectric thin film, a ferroelectric thin film covering substrate and a method for manufacturing the ferroelectric thin film in the present invention will next be described in detail with reference to the accompanying drawings.

In the present invention, a thermal oxidizing $SiO_2$ layer is formed on the surface of a silicon monocrystal wafer. A lower platinum (Pt) electrode is then formed on the thermal oxidizing $SiO_2$ layer through an adhesive layer of Ti or Ta, thus forming a substrate. Then, a titanium oxide buffer layer and a thin film of $Bi_4Ti_3O_{12}$ are continuously formed by a MOCVD method. Triortho tolylbismuth ($Bi(o-C_7H_7)_3$) is used as a bismuth raw material. Titanium isopropoxide ($Ti(i-OC_3H_7)_4$) is used as a titanium raw material. These raw materials are heated and vaporized and are supplied onto the substrate heated and held at a predetermined temperature with argon gas as a carrier together with oxygen as a reaction gas. At this time, a pressure within a film forming chamber is desirably set to be equal to or lower than 10 Torr. This is because there is a problem of easily causing a vapor phase reaction when the pressure exceeds this value. In the present invention, the raw materials are not limited to the above materials.

In accordance with film forming reports obtained conventionally, a substrate temperature is generally set to a temperature higher than 500° C. when the $Bi_4Ti_3O_{12}$ thin film is manufactured by the MOCVD method. This is because a paraelectric pyrochlore phase of $Bi_2Ti_2O_7$ is generated at a substrate temperature equal to or lower than 500° C. so that no preferable ferroelectric characteristics can be obtained with respect to the entire thin film. There is no general report example in which the thin film is formed at a substrate temperature equal to or lower than 400 ° C. Accordingly, it has been considered that no sufficient crystal property can be obtained at such a low substrate temperature. In contrast to this, when the substrate temperature is set to be higher than 500° C., the crystal property is improved, but growth of crystal grains is promoted so that a film composed of coarse crystal grains and having a surface of large irregularities tends to be formed as a whole. Therefore, a leak electric current tends to be generated when the film thickness is thin. It is necessary to set the film thickness to be close to 1 μm so as to restrict the generation of the leak electric current and obtain ferroelectric characteristics. In such a case, it is difficult to perform fine processing for manufacturing an integrated device.

In accordance with a first embodiment of the present invention, a titanium oxide buffer layer is used when a ferroelectric thin film of $Bi_4Ti_3O_{12}$ is manufactured by the MOCVD method. Accordingly, a nucleus generating density of $Bi_4Ti_3O_{12}$ can be increased as explained later. As a result, it is possible to restrain crystal grains from being coarsely formed so that the film can be closely formed and a film surface can be smoothed and a leak electric current can be restrained. A film forming temperature is set to be equal to or lower than 600 ° C.

In accordance with a second embodiment of the present invention, a thin film of $Bi_4Ti_3O_{12}$ is manufactured through a titanium oxide buffer layer and crystal grains of $Bi_4Ti_3O_{12}$ are diffused into an amorphous titanium oxide medium. In such a film structure, a leak electric current is small when a film thickness is equal to or smaller than 200 nm. Furthermore, a close thin film having sufficient ferroelectric characteristics and a smooth surface can be obtained for the following reasons. When a titanium oxide is used, a close and uniform thin film can be easily formed on a Pt electrode. When a film of $Bi_4Ti_3O_{12}$ is formed on this titanium oxide film, a crystal nucleus generating density of $Bi_4Ti_3O_{12}$ is increased since both the films include oxide, differently from the case in which the film is formed directly on the Pt electrode. Therefore, it is considered that a close thin film of $Bi_4Ti_3O_{12}$ can be easily obtained. Further, this titanium oxide buffer layer includes no elements except for constructional elements of $Bi_4Ti_3O_{12}$ as an object. Accordingly, it is also advantageous that mixing of impurities into the $Bi_4Ti_3O_{12}$ thin film can be avoided. Further, crystal grains of $Bi_4Ti_3O_{12}$ are diffused into the amorphous titanium oxide medium so that the entire film is close and has a smooth surface and a small leak electric current since the amorphous titanium oxide itself has high resistance and is extremely close. Further, in accordance with the present invention, the thin film can be formed at a low substrate temperature ranging from 300° C. to 400° C. at which it is conventionally considered that no thin film having a crystal property can be generally obtained. Accordingly, an a-axis orientating film of $Bi_4Ti_3O_{12}$ can be obtained although it is generally difficult to realize this a-axis orientating film. That is, it is possible to effectively obtain large residual spontaneous polarization components of $Bi_4Ti_3O_{12}$ in an a-axis direction.

In accordance with a third embodiment of the present invention, heat treatment is taken with respect to the thin film manufactured in the second embodiment so that the a-axis orientation of the ferroelectric thin film can be further improved.

The above embodiments of the present invention will next be explained in detail.

The first embodiment of the present invention will first be explained.

Figure 1:
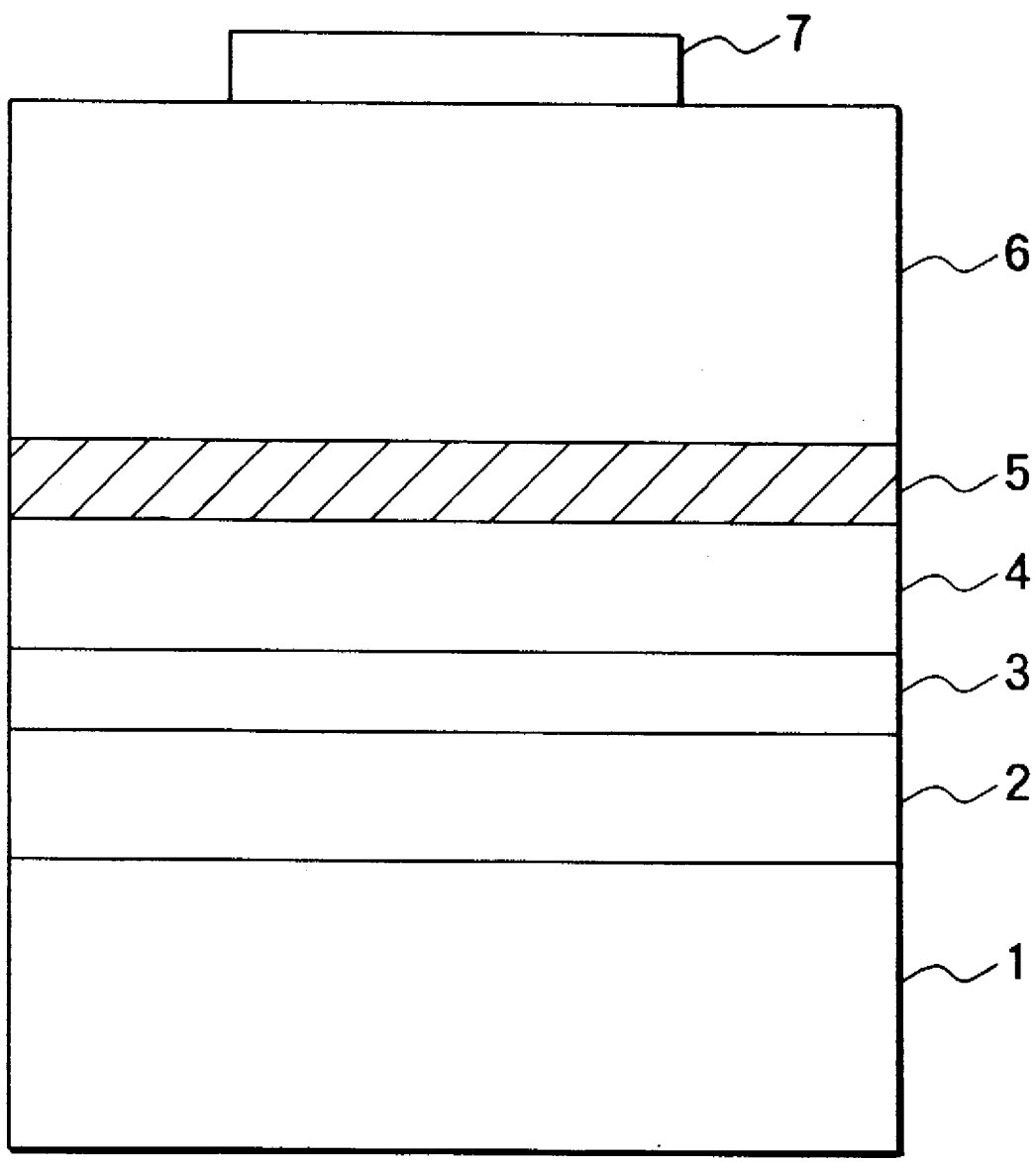
FIG. 1 is a cross-sectional view schematically showing a ferroelectric element obtained by the present invention.

As shown in FIG. 1, in this embodiment, a thermal oxide film 2 having 200 nm in thickness is formed on the surface of a substrate 1 as a (100) face of a silicon monocrystal. A platinum (Pt) lower electrode 4 orientated onto a (111) face is formed on the thermal oxide film 2 with a tantalum (Ta) layer having 30 nm in thickness as an adhesive layer 3. These constructional elements are used as a substrate. A ferroelectric thin film is formed on this substrate by using a MOCVD method. In the MOCVD film forming method, the oxide film is formed by supplying raw material gases and oxygen gas from nozzles arranged above the substrate surface heated and held at a predetermined temperature within a longitudinal type film forming chamber of a cold wall type. Triortho tolylbismuth $Bi(o-C_7H_7)_3$ and titanium isopropoxide $Ti(i-OC_3H_7)_4$ are used as raw materials. A titanium oxide buffer layer and a thin film of $Bi_4Ti_3O_{12}$ are formed by a film forming condition shown by the following Table 1.

TABLE 1

| raw material | $Bi(0-C_7H_7)_3$ | $Ti(i-OC_3H_7)_4$ |
|---|---|---|
| raw material temperature | 160° C. | 50° C. |
| carrier gas (Ar) flow rate | 200 sccm | 100 sccm |
| reaction gas ($O_2$) flow rate | 1000 sccm | |
| reaction pressure | 5T orr | |

First, the substrate temperature is set to 500° C. and only a titanium (Ti) raw material is supplied for 5 minutes so that a titanium oxide buffer layer is formed. Thereafter, Bi and Ti raw materials and $O_2$ gas are subsequently supplied simultaneously for 20 minutes so that a $Bi_4Ti_3O_{12}$ thin film is formed. For comparison, a $Bi_4Ti_3O_{12}$ thin film without any titanium oxide buffer layer is also manufactured and prepared. The manufactured thin film has 100 nm in thickness when the thin film has the titanium oxide buffer layer. The manufactured thin film has about 80 nm in thickness when the thin film has no titanium oxide buffer layer. FIGS. 2A to 2D show comparison of surface morphologies and sectional shapes shown by surface SEM photographs of the respective thin films. The surface morphologies are shown in FIGS. 2A and 2C and the sectional shapes are shown in FIGS. 2B and 2D. FIGS. 2A and 2B show a case in which the titanium oxide buffer layer is formed. FIGS. 2C and 2D show a case in which no titanium oxide buffer layer is formed. FIGS. 3a and 3b show X-ray diffractive patterns of the respective thin films. FIG. 3a shows a case in which the titanium oxide buffer layer is formed. FIG. 3b shows a case in which no titanium oxide buffer layer is formed. As shown in FIGS. 3a and 3b, it should be understood that a c-axis orientating film of $Bi_4Ti_3O_{12}$ is obtained in both the cases. However, when the thin film has no buffer layer, a film surface is formed by an aggregate of plate-shaped crystal grains having about 0.5 $\mu$m in size so that the film surface has severe irregularities. In contrast to this, when the titanium oxide buffer layer is inserted into the thin film, crystal grains having about 0.1 $\mu$m in size closely exist and the irregularities of a film surface are extremely smooth. Accordingly, it is extremely effective to insert the titanium oxide buffer layer into the thin film so as to make the $Bi_4Ti_3O_{12}$ thin film formed on this titanium oxide buffer layer close and smooth.

The substrate temperature during the film formation is preferably set to range from 450° C. to 650° C. When the substrate temperature is higher than this temperature range, crystal grains are very coarsely formed. In contrast to this, when the substrate temperature is lower than this temperature range, a pyrochlore phase is caused. The titanium oxide buffer layer preferably has a thickness equal to or smaller than 20 nm. When the titanium oxide buffer layer is thicker than 20 $\mu$m, an occupying thickness of the buffer layer with respect to the entire film thickness is increased. Accordingly, when a capacitor is formed, there is a problem of reducing an effective voltage applied to a ferroelectric substance.

A Pt electrode of a square having 60 $\mu$m in size is evaporated on the $Bi_4Ti_3O_{12}$ thin film manufactured in the first embodiment so that a capacitor is formed. When this capacitor has a titanium oxide buffer layer, ferroelectric characteristics of this capacitor are measured. A clear hysteresis curve is obtained from these measured results. For example, when a voltage of 4 V is applied to this capacitor, residual spontaneous polarization Pr is equal to 0.8 $\mu C/cm^2$ and resisting electric field Ec is equal to 17 kV/cm.

Fatigue characteristics of the ferroelectric characteristics of the film obtained in this embodiment are also measured. When a voltage of 2 V and bipolar 2-continuous pulses having 8.6 $\mu$s in pulse width are repeatedly applied to the film, a residual polarization value is changed to such an extent that Pr is reduced by about 10% when a repetitious number is $10^9$. Accordingly, the fatigue characteristics of the ferroelectric film obtained by the present invention are extremely excellent in comparison with a general PZT material (having a fatigue resisting property shown by $10^8$ times or less).

Further, when a bias voltage of 3 V is applied to the film, a leak electric current is a small value such as $0.8 \times 10^{-7} A/cm^2$.

The second embodiment of the present invention will next be explained in detail.

Effects of a film forming temperature having an influence on orientation of a $Bi_4Ti_3O_{12}$ thin film will first be considered. The $Bi_4Ti_3O_{12}$ thin film inserting a titanium oxide buffer layer thereinto is formed at a substrate temperature from 300° C. to 400° C. in a film forming condition similar to that in the first embodiment. Titanium oxide is formed for 5 minutes and $Bi_4Ti_3O_{12}$ is formed for 60 minutes. The obtained film has about 100 nm in thickness at the substrate temperature of 300° C. and has about 150 nm in thickness at the substrate temperature of 400° C. This difference in film thickness is caused since a film forming speed of a Bi raw material is rapidly reduced as the substrate temperature is reduced. Accordingly, the obtained film is constructed by a composition deficient in Bi. As a result of EPMA analysis, a Bi/Ti composition ratio of the film is 0.43 at the substrate temperature of 400° C. and is 0.21 at the substrate temperature of 300° C. However, as shown by a surface SEM photograph of the thin film obtained at the substrate temperature of 300° C. in FIG. 4A, it should be understood from surface morphology of the film that an extremely close film composed of grains having a size equal to or smaller than 0.05 $\mu$m is obtained. FIG. 4B shows a SEM sectional photograph of the thin film. FIG. 5 shows an X-ray diffractive pattern of this thin film. As can be clearly seen from FIG. 5, the X-ray diffractive pattern is different from that of the c-axis orientating film obtained in the first embodiment and reflection is recognized only at an angle of about 33° C. Composition of the manufactured thin film is greatly different from that of $Bi_4Ti_3O_{12}$ as an object. Therefore, it is considered that a phase deficient in Bi is caused. However, as a result of analysis, this reflection corresponds to (200) reflection of $Bi_4Ti_3O_{12}$ and does not correspond to reflections of $Bi_2Ti_2O_7$ and $Bi_2Ti_4O_{11}$ in which Bi is deficient and of a titanium oxide. Accordingly, it should be understood that the thin film manufactured at a low temperature is an a-axis orientating film. From these results, it is considered that a structure of the thin film obtained in this embodiment is constructed by diffusing fine crystal grains of $Bi_4Ti_3O_{12}$ into an amorphous medium having the titanium oxide as a principal component. The above results can be similarly obtained even when the substrate temperature is equal to 400° C. Namely, crystallizing temperatures of bismuth titanate and titanium oxide of deficient Bi are higher than a crystallizing temperature of $Bi_4Ti_3O_{12}$. When the substrate temperature is a low temperature ranging from 300° C. to 400° C., it is considered that Bi of the film becomes a nucleus and only $Bi_4Ti_3O_{12}$ is preferentially crystallized and the other components exist as an amorphous titanium oxide. FIGS. 8a to 8c show comparison of a film structure corresponding to this embodiment and the film structure provided in the first embodiment. Each of FIGS. 8a and 8b shows the film structure corresponding to this embodiment. FIG. 8c shows the film structure corresponding to the first embodiment.

The film manufactured above is extremely close by existence of the amorphous titanium oxide and has a very smooth surface. Further, as explained later, the thin film is extremely useful since a leak electric current can be reduced by high resistance characteristics of the titanium oxide even when the film thickness is thin.

In this embodiment, the substrate temperature during the film formation is set to a low temperature from 300° C. to 400° C. Accordingly, a film of deficient Bi entirely having a Bi/Ti composition ratio greatly shifted from that of $Bi_4Ti_3O_{12}$ can be constructed by a structure in which fine crystal grains of $Bi_4Ti_3O_{12}$ are diffused into an amorphous titanium oxide medium. Further, $Bi_4Ti_3O_{12}$ crystals can be orientated to an a-axis.

There is a problem of an extremely small Bi amount of the film when the substrate temperature during the film formation is lower than 300° C. In contrast to this, when the substrate temperature is higher than 400° C., the Bi amount of the film is increased and the a-axis orientation is lost and a pyrochlore phase is simultaneously caused.

The titanium oxide buffer layer preferably has a thickness equal to or smaller than 20 nm. When the titanium oxide buffer layer is thicker than 20 μm, an occupying thickness of the buffer layer with respect to the entire film thickness is increased. Accordingly, when a capacitor is formed, there is a problem of reducing an effective voltage applied to a ferroelectric substance.

A Pt electrode of a square having 60 μm in size is evaporated on the $Bi_4Ti_3O_{12}$ thin film manufactured at the substrate temperature of 300° C. in the second embodiment so that a capacitor is formed. Ferroelectric characteristics of this capacitor are measured. A clear hysteresis curve is obtained from these measured results and is shown in FIG. 6. For example, when a voltage of 6 V is applied to this capacitor, residual spontaneous polarization Pr is equal to 1.3 μC/cm² and resisting electric field Ec is equal to 78 kV/cm. These contents mean that an X-ray diffractive pattern in the second embodiment shows (200) reflection of $Bi_4Ti_3O_{12}$. This is because another bismuth titanate having a different Bi/Ti composition ratio has no ferroelectricity.

Fatigue characteristics of the ferroelectric characteristics of the film obtained in this embodiment are also measured. When a voltage of 2 V and bipolar 2-continuous pulses having 8.6 μs in pulse width are repeatedly applied to the film, a residual polarization value is changed to such an extent that Pr is reduced by about 8% when a repetitious number is $10^{10}$. Accordingly, the fatigue characteristics of the ferroelectric film obtained by the present invention are extremely excellent in comparison with a general PZT material (having a fatigue resisting property shown by $10^8$ repetitions or less).

Further, when a bias voltage of 3 V is applied to the film, a leak electric current is a small value such as $0.9 \times 10^{-7}$A/cm².

The third embodiment of the present invention will next be explained in detail. In the third embodiment, the thin film formed in the second embodiment is heat-treated to improve ferroelectric characteristics thereof. Namely, a high speed heat treatment (RTA) is taken for 15 seconds at each of temperatures of 400° C., 500° C. and 600° C. within an oxygen gas flow. Then, changes in crystal property and ferroelectric characteristics are examined. As a result, a-axis orientation of $Bi_4Ti_3O_{12}$ is maintained until 500° C. so that a shape of (200) reflection is sharpened and the crystal property is improved. However, reflection of $Bi_4Ti_3O_{12}$ is lost at the temperature of 600° C. and $Bi_2Ti_2O_7$ of a pyrochlore structure as a paraelectric substance is suddenly caused at this temperature. No ferroelectric characteristics can be confirmed for these reasons after the heat treatment at the temperature of 600° C. However, when the ferroelectric characteristics of the thin film heat-treated at the temperature of 500° C. are measured, improvements of Pr and Ec are seen from improvement of the crystal property in comparison with those before the heat treatment as shown in FIG. 7. Namely, Pr is equal to 4.9 μC/cm² and Ec is equal to 39 kV/cm by applying a low voltage of 2 V to the thin film. These values are obtained as a result by obtaining the thin film of a-axis orientation. These characteristic values cannot be obtained in the general c-axis orientating film even when this film is constructed by a monocrystal. Accordingly, the ferroelectric characteristics can be clearly improved by the high speed heat treatment after the thin film is formed. However, it is also found that there is an upper limit in temperature of the heat treatment. Namely, it is necessary to take the heat treatment at a temperature equal to or lower than 500° C. so as to improve the above characteristics by after-heat treatment. It is necessary to set the heat treatment temperature to be equal to or higher than 300° C. When the heat treatment temperature is lower than 300° C., the heat treatment temperature is lower than a film forming temperature so that no heat treatment effects can be recognized.

Fatigue characteristics of the ferroelectric characteristics of the film obtained in this embodiment are also measured. When a voltage of 2 V and bipolar 2-continuous pulses having 8.6 μs in pulse width are repeatedly applied to the film, a residual polarization value is changed to such an extent that Pr is reduced by about 9% when a repetitious number is $10^{11}$. Accordingly, the fatigue characteristics of the ferroelectric film obtained by the present invention are extremely excellent in comparison with a general PZT material (having a fatigue resisting property shown by $10^8$ repetitions or less).

Further, when a bias voltage of 3 V is applied to the film, a leak electric current is a small value such as $0.8 \times 10^{-7}$ A/cm$^2$.

Many widely different embodiments of the present invention may be constructed without departing from the spirit and scope of the present invention. It should be understood that the present invention is not limited to the specific embodiments described in the specification, except as defined in the appended claims.

What is claimed is:

1. A substrate covered with a buffer layer and a ferroelectric thin film, laid on the buffer layer, wherein the ferroelectric thin film comprises ferroelectric crystals in an amorphous medium, the crystals being oriented on the a-axis, and wherein a Bi/Ti ratio of the entire ferroelectric thin film is on the order of 0.2 to 0.43.

2. A substrate as claimed in claim 1, wherein the ferroelectric crystals are formed from a compound having a chemical formula of $Bi_2A_{m-1}B_mO_{3m+3}$, wherein A is selected from the group consisting of $Na^{1+}$, $K^{1+}$, $Pb^{2+}$, $Ca^{2+}$, $Sr^{2+}$, $Ba^{2+}$ and $Bi^{3+}$; B is selected from the group consisting of $Fe^{3+}$, $Ti^{4+}$, $Nb^{5+}$, $Ta^{5+}$, $W^{6+}$ and $Mo^{6+}$; m is a natural number from 1 to 8, and said buffer layer is formed by a titanium oxide.

3. A substrate as claimed in claim 2, wherein the ferroelectric crystals are formed of $Bi_4Ti_3O_{12}$ and the amorphous medium is formed of a titanium oxide.

4. A substrate covered with a buffer layer formed by a titanium oxide and a ferroelectric thin film, laid on the buffer layer, wherein the ferroelectric thin film comprises ferroelectric crystals in an amorphous medium, wherein a Bi/Ti ratio of the entire ferroelectric thin film is on the order of 0.2 to 0.43, and wherein the crystals are oriented on the a-axis and formed from a compound having a chemical formula of $Bi_2A_{m-1}B_mO_{3m+3}$, wherein A is selected from the group consisting of $Na^{1+}$, $K^{1+}$, $Pb^{2+}$, $Ca^{2+}$, $Sr^{2+}$, $Ba^{2+}$ and $Bi^{3+}$; B is selected from the group consisting of $Fe^{3+}$, $Ti^{4+}$, $Nb^{5+}$, $Ta^{5+}$, $W^{6+}$ and $Mo^{6+}$; and m is a natural number from 1 to 8.

5. A substrate as claimed in claim 4, wherein said ferroelectric crystals are formed of $Bi_4Ti_3O_{12}$.

* * * * *